(12) United States Patent
Ogata et al.

(10) Patent No.: US 11,360,300 B2
(45) Date of Patent: Jun. 14, 2022

(54) MOVABLE REFLECTIVE DEVICE

(71) Applicant: DAI-ICHI SEIKO CO., LTD., Kyoto (JP)

(72) Inventors: Kenji Ogata, Ogori (JP); Shogo Kurogi, Ogori (JP)

(73) Assignee: DAI-ICHI SEIKO CO., LTD., Kyoto (JP)

( * ) Notice: Subject to any disclaimer, the term of this patent is extended or adjusted under 35 U.S.C. 154(b) by 213 days.

(21) Appl. No.: 16/340,366

(22) PCT Filed: Nov. 1, 2017

(86) PCT No.: PCT/JP2017/039489
§ 371 (c)(1),
(2) Date: Apr. 8, 2019

(87) PCT Pub. No.: WO2018/088291
PCT Pub. Date: May 17, 2018

(65) Prior Publication Data
US 2020/0049978 A1  Feb. 13, 2020

(30) Foreign Application Priority Data

Nov. 9, 2016  (JP) .............................. JP2016-218812

(51) Int. Cl.
*G02B 26/08* (2006.01)
*G02B 26/10* (2006.01)

(52) U.S. Cl.
CPC ....... *G02B 26/0858* (2013.01); *G02B 26/101* (2013.01)

(58) Field of Classification Search
CPC ......... G02B 26/0816–0858; G02B 26/10–101; G02B 26/105
See application file for complete search history.

(56) References Cited

U.S. PATENT DOCUMENTS 7,605,965 B2 * 10/2009 Tani ...................... B81B 7/0016
                                                    359/224.1
8,125,120 B2 *  2/2012 Okazaki ............... H04N 5/2171
                                                     310/317
(Continued)

FOREIGN PATENT DOCUMENTS

CN    101165534 A    4/2008
CN    101630063 A    1/2010
(Continued)

OTHER PUBLICATIONS

International Search Report and Written Opinion (International Application No. PCT/JP2017/039489); dated Jan. 16, 2018; 8 pages.
(Continued)

*Primary Examiner* — Christopher Stanford
(74) *Attorney, Agent, or Firm* — Howard & Howard Attorneys PLLC

(57) ABSTRACT

An actuator includes an arm starting end having a piezoelectric element, a first end of the arm starting end connected to an inner side of a fixed frame, the arm starting end extending in a straight line, along a Y-axis direction through a gap between the fixed frame and a mirror surface, from the first end to beyond a middle point of an outer side of the mirror surface; an arm terminating end including a first end connected to the middle point of the outer side of the mirror surface, the arm terminating end extending parallel to the arm starting end; and an arm relay that connects a second end of the arm starting end to a second end of the arm terminating end, the arm relay being formed in a zigzag.

10 Claims, 9 Drawing Sheets

(56) References Cited

U.S. PATENT DOCUMENTS

| | | | | |
|---|---|---|---|---|
| 8,730,549 | B2* | 5/2014 | Aimono | G02B 26/0858 |
| | | | | 359/224.1 |
| 8,817,351 | B2* | 8/2014 | Koyama | G02B 26/101 |
| | | | | 359/200.8 |
| 9,097,894 | B2* | 8/2015 | Tani | G02B 26/0858 |
| 9,678,335 | B2* | 6/2017 | Naono | H02N 2/103 |
| 9,864,189 | B2* | 1/2018 | Naono | H01L 41/1876 |
| 9,910,269 | B2* | 3/2018 | van Lierop | G02B 26/0841 |
| 10,018,833 | B2* | 7/2018 | Murayama | G02B 27/646 |
| 10,281,716 | B2* | 5/2019 | Naono | H01L 41/0993 |
| 10,371,940 | B2* | 8/2019 | Naono | G02B 26/10 |
| 2008/0094677 | A1 | 4/2008 | Mizoguchi | |
| 2010/0014143 | A1 | 1/2010 | Kanno et al. | |
| 2011/0032590 | A1* | 2/2011 | Terada | H01L 41/0953 |
| | | | | 359/199.4 |
| 2013/0063800 | A1 | 3/2013 | Naono | |
| 2013/0083379 | A1 | 4/2013 | Tanaka et al. | |
| 2013/0163061 | A1* | 6/2013 | Kanno | G02B 7/1821 |
| | | | | 359/224.1 |
| 2013/0301099 | A1 | 11/2013 | Mizoguchi et al. | |
| 2013/0301103 | A1* | 11/2013 | Aimono | G02B 26/0858 |
| | | | | 359/224.1 |
| 2013/0308173 | A1 | 11/2013 | Muchow et al. | |
| 2014/0198259 | A1* | 7/2014 | Murayama | H04N 9/3135 |
| | | | | 348/742 |
| 2014/0226194 | A1 | 8/2014 | Mihara et al. | |
| 2014/0355089 | A1 | 12/2014 | Murayama et al. | |
| 2015/0021483 | A1 | 1/2015 | Murayama | |
| 2015/0049155 | A1 | 2/2015 | Morikawa et al. | |
| 2015/0103386 | A1 | 4/2015 | Tanaka et al. | |
| 2015/0362724 | A1 | 12/2015 | Ikegami et al. | |

FOREIGN PATENT DOCUMENTS

| | | | |
|---|---|---|---|
| CN | 102998795 A | 3/2013 | |
| CN | 103389576 A | 11/2013 | |
| CN | 103827725 A | 5/2014 | |
| CN | 104094160 A | 10/2014 | |
| CN | 104272166 A | 1/2015 | |
| CN | 104380173 A | 2/2015 | |
| JP | 4092283 A | 6/2005 | |
| JP | 2010-263736 A | 11/2010 | |
| JP | 2013-080068 A | 5/2013 | |
| JP | 2013-160887 A | 8/2013 | |
| JP | 2014-164101 A | 9/2014 | |
| JP | 2015-022206 A | 2/2015 | |
| JP | 2016-009050 A | 1/2016 | |

OTHER PUBLICATIONS

Extended European Search Report (EP Application No./Patent No. 17869061.6-1020 / 3540496); dated Aug. 6, 2020; 11 pages.

Notification of First Office Action (CN Application No. 201780065599.9); dated Sep. 25, 2020; Includes English Translation; 14 pages.

Chinese language Office Action from Chinese Patent Application No. 201780065599.9 dated Apr. 28, 2021; 15 pages.

English language abstract of Chinese Patent Publication No. CN 101165534 A extracted from www.espacenet.com on Apr. 29, 2021; See English language equivalent U.S. Patent Publication No. 2008/094677 A1; 2 pages.

English language abstract of Chinese Patent Publication No. CN 101630063 A extracted from www.espacenet.com on Apr. 29, 2021; See English language equivalent U.S. Patent Publication No. 2010/0014143 A1; 2 pages.

English language abstract of Chinese Patent Publication No. CN 102998795 A extracted from www.espacenet.com on Apr. 29, 2021; See English language equivalent U.S. Patent Publication No. 2013/0063800 A1; 2 pages.

English language abstract of Chinese Patent Publication No. CN 103389576 A extracted from www.espacenet.com on Apr. 29, 2021; See English language equivalent U.S. Patent Publication No. 2013/0301099 A1; 2 pages.

English language abstract of Chinese Patent Publication No. CN 103827725 A extracted from www.espacenet.com on Apr. 29, 2021; See English language equivalent U.S. Patent Publication No. 2014/0226194 A1; 2 pages.

English language abstract of Chinese Patent Publication No. CN 104272166 A extracted from www.espacenet.com on Apr. 29, 2021; See English language equivalent U.S. Patent Publication No. 2015/0036201 A1; 2 pages.

English language abstract of Chinese Patent Publication No. CN 104380173 A extracted from www.espacenet.com on Apr. 29, 2021; See English language equivalent U.S. Patent Publication No. 2015/0049155 A1; 2 pages.

* cited by examiner

MOVABLE REFLECTIVE DEVICE

CROSS-REFERENCE TO RELATED APPLICATIONS

This application is a national phase application of International Patent Application No. PCT/JP2017/039489, filed Nov. 1, 2017, which claims priority to JP Patent Application No. 2016-218812, filed Nov. 9, 2016, the disclosures of which are hereby incorporated by reference in their entirety.

TECHNICAL FIELD

This application relates generally to a movable reflective device.

BACKGROUND ART

In the related art, movable reflective devices as micro electro mechanical systems (MEMS) devices that are manufacturable using semiconductor manufacturing processes are proposed. For example, the movable reflective device described in Patent Literature 1 includes an outer actuator that extends from the inner side of a fixed frame to a rotational axis of a movable frame, and an inner actuator that extends from the movable frame to a rotational axis of a mirror (a rotational axis orthogonal to the rotational axis of the movable frame). The outer actuator causes the movable frame to rock at a low frequency (horizontal scanning frequency) along one of the rotational axes and, at the same time, the inner actuator causes the mirror to rock at a high frequency (vertical scanning frequency) along the other rotational axis. With this movable reflective device, it is possible to two-dimensionally scan light reflected from the mirror in the horizontal direction and the vertical direction.

CITATION LIST

Patent Literature

Patent Literature 1: Japanese Patent No. 4092283

SUMMARY OF INVENTION

Technical Problem

Depending on the apparatus that the movable reflective device is to be incorporated into, comparatively large rocking angles of the mirror may be required. However, with the movable reflective device described in Patent Literature 1, the length of the outer actuator is limited by the distance between the inner side of the fixed frame and the middle point of the outer side of the movable frame on which the rotational axis is disposed. Additionally, eliminating this limitation and connecting the actuator at a location other than the middle point of the outer side of the movable frame will make it difficult to rock the mirror in the desired direction. Thus, it is difficult to obtain an optimal rocking state in which the rocker, on which the mirror is formed, can be rocked in the desired direction and, at the same time, also the rocking angle of the mirror can be increased to a desired value.

In light of these problems, an objective of the present disclosure is to provide a movable reflective device that can cause a rocker on which a mirror is formed to rock in an optimal state.

Solution to Problem

A movable reflective device according to a first aspect of the present disclosure that achieves the objective described above includes:

a fixed frame, the fixed frame comprising a flat plate-like shape;

a rocker that includes a reflective surface, the rocker being disposed within the fixed frame such that a gap exists between the rocker and the fixed frame, a mirror surface being formed on a first side of rocker; and a first actuator that connects the fixed frame to the rocker, the first actuator being a pair of flexible members on which a piezoelectric element, configured to be capable of expansion and contraction, is formed at a portion extending along a first direction or a portion extending along a second direction that intersects the first direction, each of the pair of members being disposed on each side in the second direction of the rocker, the first actuator being deformed by the expansion and contraction of the piezoelectric element, thereby causing the rocker to rock with respect to the fixed frame around a first rotational axis; wherein the first actuator includes:

a first arm starting end on which the piezoelectric element is formed, a first end of the first arm starting end being connected to an inner side of the fixed frame, the first arm starting end extending in a straight line, along the first direction through the gap between the fixed frame and the rocker, from the first end to beyond a middle point of an outer side of the rocker, a first arm terminating end including a first end connected to the middle point of the outer side of the rocker, the first arm terminating end extending parallel to the first arm starting end, and a first arm relay that connects a second end of the first arm starting end to a second end of the first arm terminating end, the first arm relay being formed in a zigzag by alternately connecting a first arm connector extending along the second direction and a first arm extension extending parallel to the first arm starting end and on which the piezoelectric element is formed.

A configuration is possible in which the piezoelectric element that expands and contracts along the first direction is formed on the first actuator at a portion extending along the first direction.

Additionally, a configuration is possible in which the piezoelectric element that expands and contracts along the second direction is formed on the first actuator at a portion extending along the second direction.

A configuration is possible in which the rocker includes:

a movable frame comprising a flat plate-like shape, the movable frame being connected to the first actuator and disposed within the fixed frame such that a gap exists between the movable frame and the fixed frame, a mirror surface comprising a flat plate-like shape, the mirror surface including a reflective surface and being disposed within the movable frame such that a gap exists between the mirror surface and the movable frame, and a second actuator that connects the movable frame to the mirror surface, the second actuator being a pair of flexible members on which a piezoelectric element, configured to be capable of expansion and contraction, is formed at a portion extending along the first direction or a portion extending along the second direction, each of the members being disposed on each side in the first direction of the rocker, the second actuator being deformed by the expansion and contraction of the piezoelectric element, thereby causing the mirror surface to rock with respect to the movable frame around a second rotational axis that intersects the first rotational axis.

A configuration is possible in which the second actuator includes:

a second arm starting end on which the piezoelectric element is formed, a first end of the second arm starting end being connected to an inner side of the movable frame, the second arm starting end extending in a straight line, along the second direction through the gap between the movable frame and the mirror surface, from the first end to beyond a middle point of an outer side of the mirror surface, a second arm terminating end including a first end connected to the middle point of the outer side of the mirror surface, the second arm terminating end extending parallel to the second arm starting end, and a second arm relay that connects a second end of the second arm starting end to a second end of the second arm terminating end, the second arm relay being formed in a zigzag by alternately connecting a second arm connector extending along the first direction and a second arm extension extending parallel to the second arm starting end and on which the piezoelectric element is formed.

A configuration is possible in which the piezoelectric element that expands and contracts along the second direction is formed on the second actuator at a portion extending along the second direction.

A configuration is possible in which the piezoelectric element that expands and contracts along the first direction is formed on the second actuator at a portion extending along the first direction.

A configuration is possible in which:

each of the first actuators is disposed with two-fold rotational symmetry about the mirror surface, each of the second actuators is disposed with two-fold rotational symmetry about the mirror surface, and a direction from the first end toward the second end of the first arm starting end, and a direction from the first end toward the second end of the second arm starting end are the same with respect to a rotational direction around the mirror surface.

A configuration is possible in which:

each of the first actuators is disposed with two-fold rotational symmetry about the mirror surface, each of the second actuators is disposed with two-fold rotational symmetry about the mirror surface, and a direction from the first end toward the second end of the first arm starting end, and a direction from the first end toward the second end of the second arm starting end are opposite directions with respect to a rotational direction around the mirror surface.

A configuration is possible in which:

the movable reflective device according to the first aspect further includes at least one selected from the group consisting of a first detection electrode that detects displacement of the first actuator and a second detection electrode that detects displacement of the second actuator, wherein the first detection electrode is provided at a portion where the first actuator connects to the fixed frame, and the second detection electrode is provided at a portion where the second actuators connects to the movable frame.

A configuration is possible in which a weight is attached to the rocker.

Advantageous Effects of Invention

According to the present disclosure, the pair of first actuators that rock the rocker have a zigzag shape obtained by alternately connecting the arm connector and the arm extension. Moreover, the first actuators are connected to the middle points of the outer sides of the rocker. As a result of this configuration, the twist angle of the rocker can be increased and, as the same time, the rotational axis of the rocker can be made to coincide with the direction connecting the middle points of the outer sides of the rocker. Therefore, the rocker can be accurately rocked. That is, the rocker can be rocked in an optimal state.

DESCRIPTION OF EMBODIMENTS

Hereinafter, embodiments of the present disclosure are described in detail while referencing the drawings.

Embodiment 1

First, Embodiment 1 of the present disclosure will be described.

Figure 1:
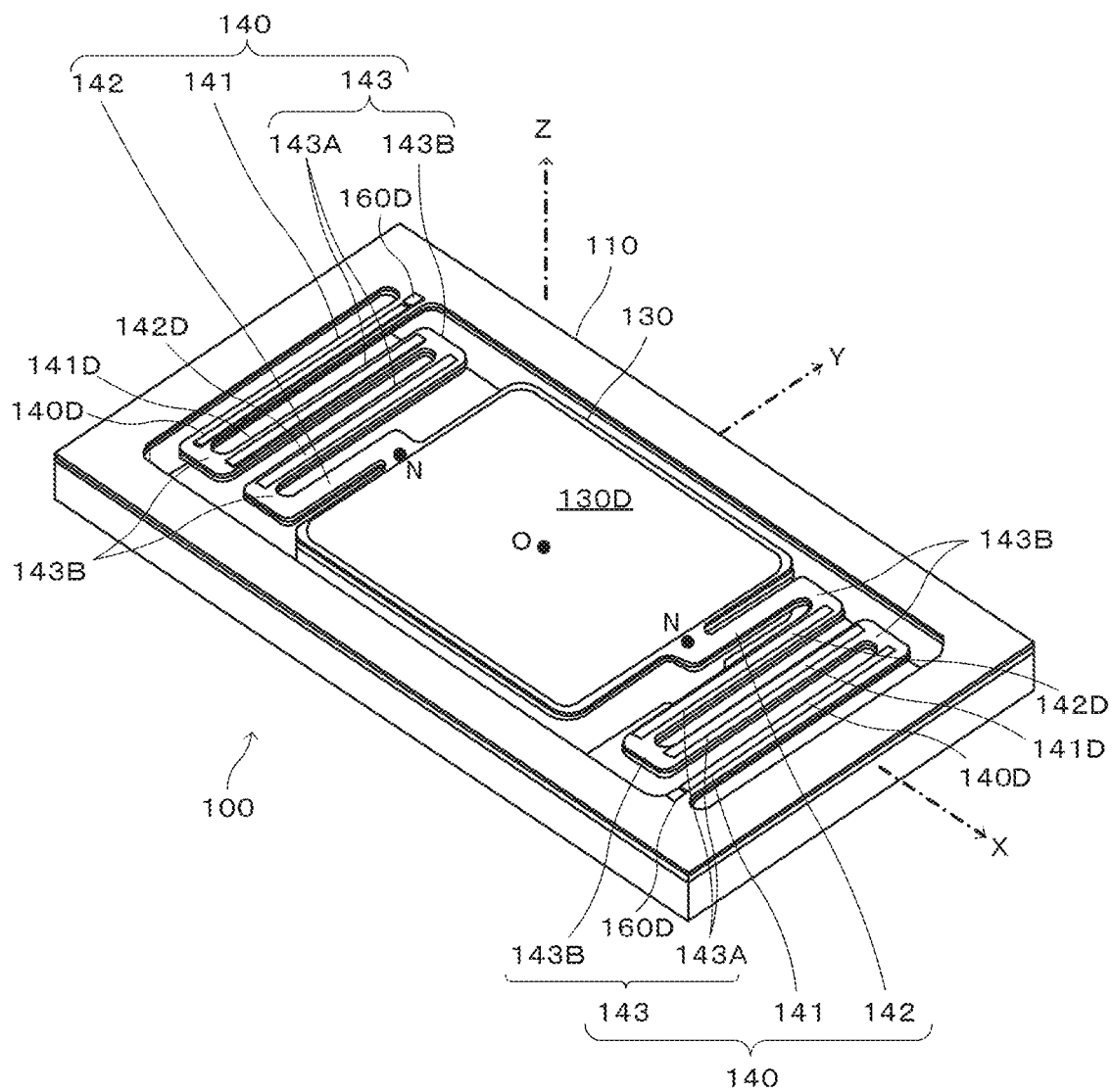
FIG. 1 is a perspective view illustrating the configuration of a movable reflective device according to Embodiment 1 of the present disclosure.

As illustrated in FIG. 1, a movable reflective device 100 has a rectangular flat plate-like overall shape. A slit is formed in the flat plate of the movable reflective device 100. The movable reflective device 100 includes a fixed frame 110, a mirror surface 130, and an actuator 140. In the present embodiment, the mirror surface 130 corresponds to the rocker, and the actuator 140 corresponds to the first actuator.

The fixed frame 110 is a flat plate-like frame that is disposed on the outermost periphery of the movable reflective device 100. The mirror surface 130 is a rectangular flat plate-like member that is disposed within the fixed frame 110. The actuator 140 is a pair of members that connect the fixed frame 110 to the mirror surface 130. The members are respectively provided on either end of the mirror surface 130.

Here, an XYZ three-dimensional orthogonal coordinate system with an origin O is defined. The center of gravity of the mirror surface 130 is positioned at the origin O. In this XYZ coordinate system, in FIG. 1, the direction in which the actuators 140 are disposed with respect to the mirror surface 130 is defined as the X-axis, a direction orthogonal to the X-axis in a reflective layer 130D of the mirror surface 130 is defined as the Y-axis, and a normal direction of the reflective layer 130D of the mirror surface 130 is defined as the Z-axis. In the present embodiment, the first direction corresponds to the Y-axis and the second direction corresponds to the X-axis. A first rotational axis is an imaginary rotational axis near the X-axis, and a second rotational axis is an imaginary rotational axis near the Y-axis.

The fixed frame 110 is fixed to a base (not illustrated in the drawings). The mirror surface 130 is used while in a state not directly fixed to the base. The actuators 140 are provided between the fixed frame 110 and the mirror surface 130. Specifically, one of the pair of the actuators 140 is provided on each side in the X-axis direction of the mirror surface 130. The actuators 140 connect the fixed frame 110 to the mirror surface 130.

Figure 2:
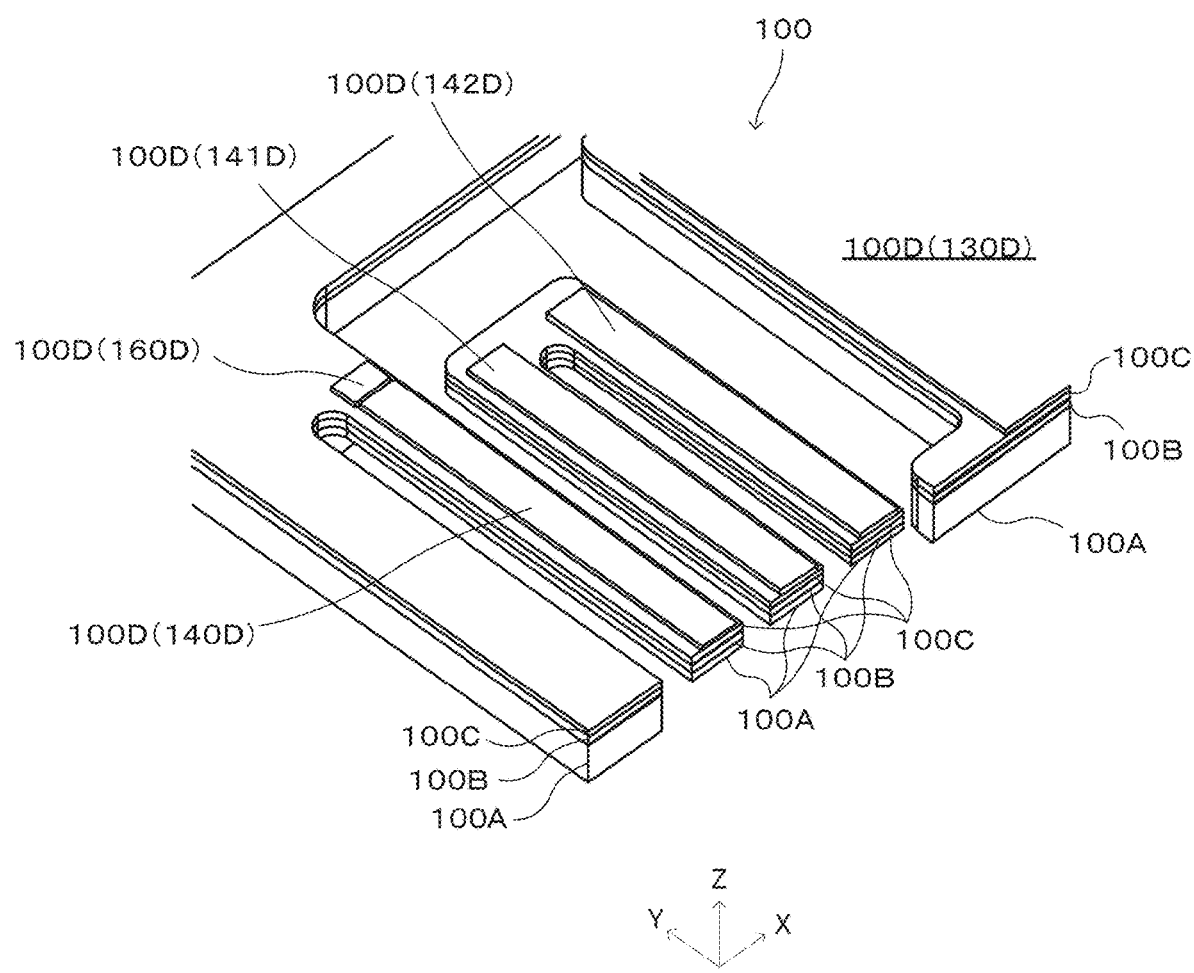
FIG. 2 is a schematic view illustrating a laminated structure of a portion of the movable reflective device depicted in FIG. 1.

As illustrated in FIG. 2, the movable reflective device 100 includes a laminated structure obtained by sequentially laminating an A-layer 100A, a B-layer 100B, and a C-layer 100C. The A-layer 100A is actually divided into three layers. These three layers are described later. The fixed frame 110, the mirror surface 130, and the actuators 140 include the three-layer structure of the A-layer 100A, the B-layer 100B, and the C-layer 100C.

Figure 3:
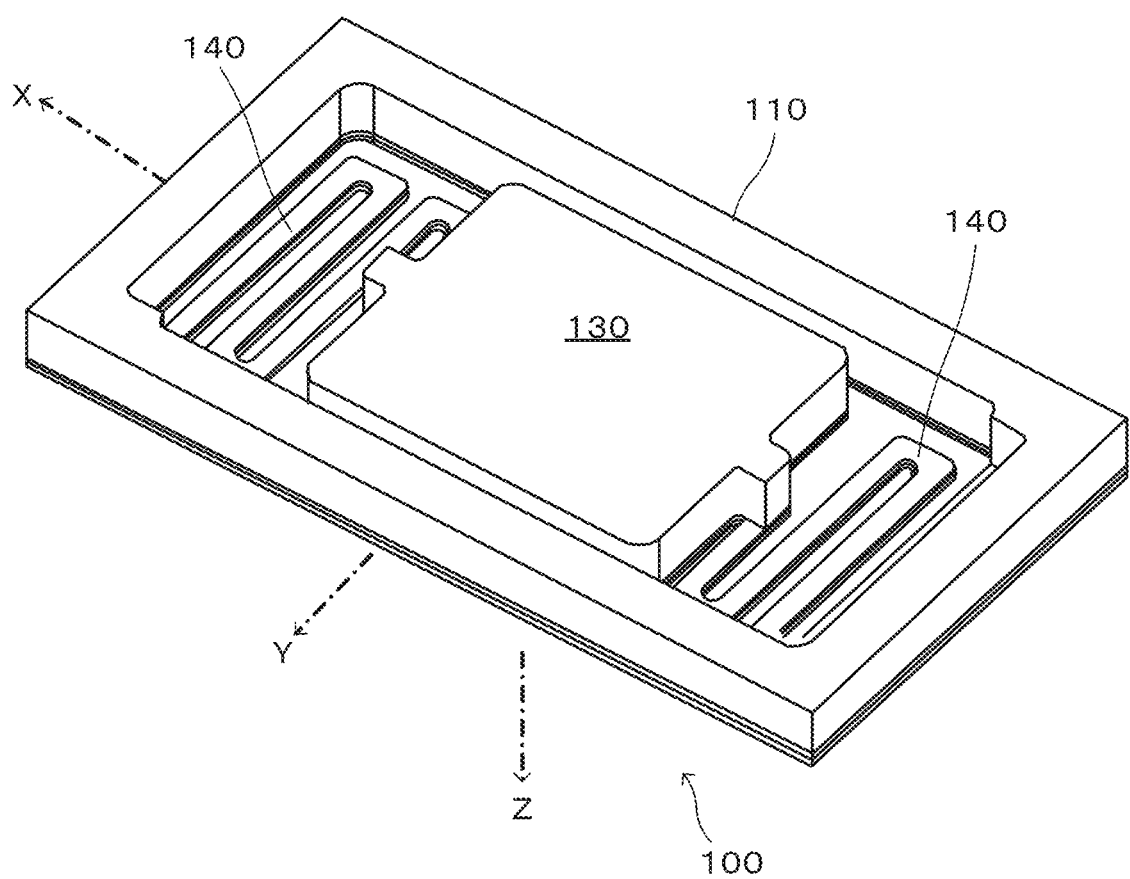
FIG. 3 is a perspective view of the movable reflective device depicted in FIG. 1, viewed from the back side.

As illustrated in FIG. 3, the thickness of the actuators 140 is set so as to be less than the thicknesses of the fixed frame 110 and the mirror surface 130. As a result of this configuration, gaps are formed below the actuators 140. The mirror surface 130 and the actuators 140 float above the base in the space surrounded by the fixed frame 110.

The actuators 140 are flexible in at least the vertical direction (the Z-axis direction), and can flex upward and downward. As such, the actuators 140 can rock the mirror surface 130 with respect to the fixed frame 110 within the range of a predetermined degree of freedom. A reflective surface is formed on the +Z side (discussed later) of the top surface of the mirror surface 130. The reflective surface reflects incident light, electromagnetic waves, and other beams.

The A-layer 100A, the B-layer 100B, and the C-layer 100C have the same planar shape (the shape illustrated in FIG. 1). However, a D-layer 100D has a planar shape that differs from that of the A-layer 100A, the B-layer 100B, and the C-layer 100C.

The D-layer 100D corresponds to upper electrode layers 140D, 141D, and 142D, which are formed in the actuators 140, the reflective layer 130D formed on the mirror surface 130, and a detection electrode 160D that serves as a first detection electrode. With the exception of wiring, a D-layer is not formed on the fixed frame 110. Note that the wiring provided on the fixed frame 110 are not illustrated in the drawings. The upper electrode layers 140D, 141D, and 142D form an electrode of a piezoelectric element. The reflective layer 130D forms the reflective surface of the mirror surface 130. The detection electrode 160D forms an electrode for detecting displacement of the mirror surface 130. It is not necessary to form D-layers in the other portions.

As described above, a D-layer that functions as wiring is formed on the fixed frame 110. However, since the upper electrodes 140D, 141D, and 142D each form an individual piezoelectric element, the upper electrodes 140D, 141D, and 142D must be electrically insulated. Therefore, it is not preferable that D-layers having the same planar shape be formed on the entire top surface of the C-layer.

Next, the materials of the A-layer 100A, the B-layer 100B, the C-layer 100C, and the D-layer 100D of the movable reflective device 100 will be described. The A-layer 100A is a base layer serving as a support substrate of the other various layers. The A-layer 100A is formed from a material capable of supporting the B-layer 100B, the C-layer 100C, and the D-layer 100D, which are formed on the top surface of the A-layer 100A. Note that the actuators 140 must be flexible in at least the vertical direction (the Z-axis direction). That is, the A-layer 100A serving as the base layer is formed from a material that is somewhat flexible so that each of the actuators 140 can deflect in a required range (in the range required to tilt the mirror surface 130 at a desired angle). In the present embodiment, the A-layer 100A is implemented as a silicon substrate. More specifically, the A-layer 100A has a three-layer structure including a support layer made from silicon, a silicon BOX layer (silicon dioxide insulating film) formed on the support layer, and an active layer made from silicon formed on the BOX layer.

A configuration is possible in which the A-layer 100A does not include the BOX layer and has a two-layer structure including the support layer and the active layer. Alternatively, the A-layer 100A may be implemented as a single-layer silicon substrate.

The B-layer 100B forms the lower electrode of the piezoelectric elements. The D-layer 100D forms the upper electrode of the piezoelectric elements. Accordingly, the B-layer 100B and the D-layer 100D are formed from an electrically conductive material.

The C-layer 100C constitutes the piezoelectric element, and is formed from a piezoelectric material that exhibits piezoelectric effects. In one example, the C-layer 100C is formed from a thin film of PZT (lead zirconate titanate) or KNN (potassium sodium niobate). In the present embodiment, the piezoelectric element comprises a sandwich structure obtained by sandwiching a piezoelectric material layer (the C-layer 100C) between electrically conductive layers (the B-layer 100B and the D-layer 100D).

Note that, the portion of the D-layer 100D formed on each of the actuators 140 constitutes the upper electrode layer of the piezoelectric element, as described above. However, a D-layer 130D to be formed on the mirror surface 130 functions as the reflective layer of the mirror surface 130. Accordingly, it is sufficient that the upper electrode layers 140D, 141D, and 142D of the actuators 140 be electrically conductive, and the surfaces thereof need not be reflective. Additionally, it is sufficient that the surface of the D-layer 130D to be formed on the mirror surface 130 be reflective, and need not be an electrically conductive layer. However, when mass-producing the movable reflective device 100, the upper electrode layers 140D, 141D, and 142D and the reflective layer 130D are formed as the D-layer 100D and are made from the same material. In this case, a material that has both electrode layer functions and reflective layer functions is used as the material of the D-layer 100D.

More specifically, the top surface of the D-layer 100D must also function as the reflective surface (mirror surface) and, as such, it is preferable that the top surface portion of the D-layer 100D be formed from a material with high reflectivity and excellent corrosion resistance such as, for example, a thin film layer of gold (Au). Thin film layers of gold (Au) have excellent reflectance with respect to light and electromagnetic waves, and also have excellent corrosion resistance. Accordingly, such a thin film layer can demonstrate stable reflection performance over an extended period of time. Note that the B-layer 100B need only function as the lower electrode (electrically conductive layer) and, as such, the B-layer 100B may be formed from a desired metal layer.

The movable reflective device 100 has a structure suitable for mass production. A MEMS device manufacturing method that utilizes a semiconductor manufacturing process can be used to manufacture the movable reflective device 100. The movable reflective device 100 is formed by sequentially laminating, on the top surface of the silicon substrate (the A-layer 100A: base layer), a platinum layer (B-layer 100B: lower electrode layer), a PZT layer (C-layer 100C; piezoelectric material layer), and a platinum/gold layer (D-layer 100D: two-layer structure in which platinum is used for the lower layer portion and gold is used for the upper layer portion). Using platinum as the upper electrode layer and the lower electrode layer makes it possible to form an excellent interface between the electrodes and the PZT layer, which serves as the piezoelectric material layer. Meanwhile, as described above, it is preferable that gold be used as the reflective layer. As such, platinum, which is suitable for the upper electrode layer, is used for the lower layer portion of the D-layer, and gold, which is suitable for the reflective layer, is used for the upper layer portion.

After the four-layer laminated structure is formed, the D-layer 100D is subjected to a patterning process. Furthermore, the portion of the structure made from the three-layers of the A-layer 100A, the B-layer 100B, and the C-layer 100C is subjected to etching or the like to form a slit that penetrates the structure in the vertical direction. Additionally, portions of the bottom surface side of the actuators 140 and the mirror surface 130 are removed by etching or the like. Thus, the movable reflective device 100 is completed.

Next, examples of the dimensions of the various components of the movable reflective device 100 are described. The A-layer 100A is a 5 mm square silicon substrate with a thickness of 0.3 mm. The B-layer 100B is a thin film layer of platinum with a thickness of about 300 nm. The C-layer 100C is a PZT layer with a thickness of about 2 mm. The D-layer 100D is a thin film layer of platinum/gold with a thickness of about 300 nm. In this example, the bottom surface side of the silicon substrate (A-layer 100A) is etched and removed to set the thickness of the actuators 140 to 0.10 mm. As a result of this etching, a 0.20 mm gap is formed between the top surface of the base and the actuators 140. The width of the silts between the fixed frame 110 and the actuators 140 and between the actuators 140 and the mirror surface 130 are set to 0.3 mm, and the width of the actuators 140 is set to 0.5 mm.

The dimensions of the various components can be changed as desired. The thickness, the width, and the length of the actuators 140 may be changed to any dimensions provided that flexibility can be obtained that allows the mirror surface 130 to be tilted in a predetermined angle range (range that satisfies the performance required for the movable mirror). The thickness of the fixed frame 110 may be set to any dimension provided that the movable reflective device 100 can be securely fixed to the base.

As illustrated in FIG. 1, the actuators 140 are a pair of flexible members that connect the fixed frame 110 to the mirror surface 130. In addition, piezoelectric elements that expand/contract along the Y-axis direction are formed on the portions of the actuators 140 that extend along the Y-axis direction from the inner side of the fixed frame 110. Each of the actuators 140 is disposed on either side in the X-axis direction of the mirror surface 130, and deforms due to the expansion/contraction of the piezoelectric elements, thereby rocking the mirror surface 130 with respect to the fixed frame 110 around a rotational axis extending along the X-axis direction. Each of the actuators 140 includes three portions, namely an arm starting end 141 as the first arm starting end, an arm terminating end 142 as the first arm terminating end, and an arm relay 143 as the first arm relay. That is, each of the actuators 140 includes the arm starting end 141, the arm terminating end 142, and the arm relay 143.

A first end of the arm starting end 141 is connected to the inner side of the fixed frame 110. The arm starting end 141 extends in a straight line along the Y-axis direction between the fixed frame 110 and the mirror surface 130, from the first end beyond a middle point N of the outer side of the mirror surface 130. A piezoelectric element constituted by the upper electrode layer 140D is formed on the arm terminating end 142.

A first end of the arm terminating end 142 is connected to the middle point N of the outer side of the mirror surface 130. The arm terminating end 142 extends parallel to the arm starting end 141.

The arm relay 143 is formed in a zigzag shape by alternately connecting an arm connector 143B, as the first arm connector, that extends along the X-axis direction and an arm extension 143A, as the first arm extension, that extends parallel to the arm starting end 141. The arm relay 143 connects a second end of the arm starting end 141 to a second end of the arm terminating end 142.

A piezoelectric element is formed on the arm starting end 141. This piezoelectric element is formed by the B-layer 100B (lower electrode layer), the C-layer 100C (piezoelectric element material layer), and the D-layer 140D (upper electrode layer). Piezoelectric elements are also formed on the two arm extensions 143A of the arm relay 143. These piezoelectric elements are formed by the B-layer 100B (lower electrode layer), the C-layer 100C (piezoelectric element material layer), and the D-layers 141D and 142D (upper electrode layers). Each of these piezoelectric elements is independently formed.

The actuators 140 are disposed with two-fold rotational symmetry about the center of gravity G of the mirror surface 130.

Next, the operations of the actuators 140 will be described. In one example, the A-layer 100A (base layer), the B-layer 100B (lower electrode layer), the C-layer 100C (piezoelectric material layer), and the D-layer 140D (upper electrode layer) are formed on the arm starting end 141. The A-layer 100A (base layer) is referred to as "actuator main body 100A". The three-layer structure portion including the B-layer 100B (lower electrode layer), the C-layer 100C (piezoelectric element material layer), and the D-layer 140D (upper electrode layer) is referred to as "piezoelectric element (100B, 100C, 140D)." Thus, it can be said that the arm starting end 141 is formed by a flexible actuator main body 100A, and a piezoelectric element (100B, 100C, 140D) fixed to the top surface of the actuator main body 100A.

Figure 4A:
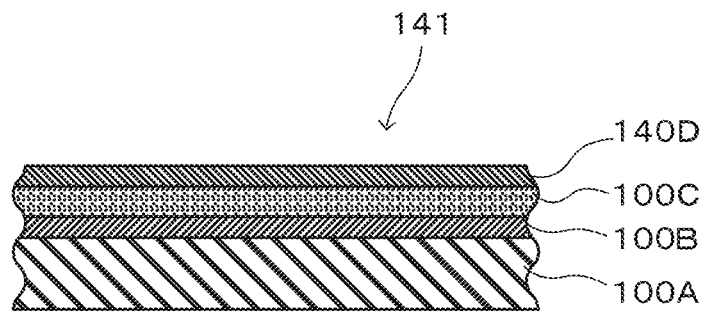
FIG. 4A is a drawing illustrating (a first) operation of a piezoelectric element.
Figure 4B:
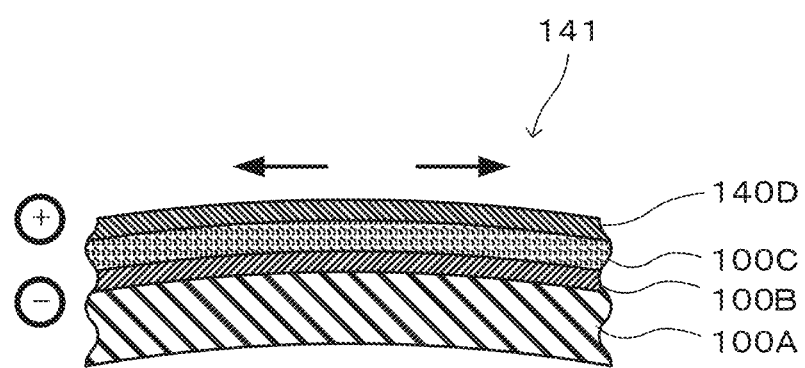
FIG. 4B is a drawing illustrating (a second) operation of the piezoelectric element.
Figure 4C:
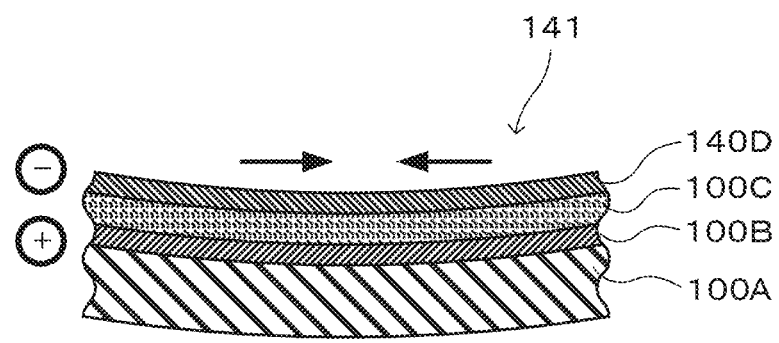
FIG. 4C is a drawing illustrating (a third) operation of the piezoelectric element.

FIGS. 4A, 4B, and 4C are cross-sectional view illustrating the operations of the arm starting end 141. As illustrated in FIG. 4A, the A-layer 100A is the actuator main body, which is made from a silicon substrate or the like, and the three-layer structure including the B-layer 100B, the C-layer 100C, and the D-layer 140D is the piezoelectric element. The C-layer 100C expands/contracts in the longitudinal direction (direction orthogonal to the thickness direction) when voltage of a predetermined polarity is applied in the thickness direction.

When voltage is applied between the upper and lower electrode layers such that the D-layer 140D (upper electrode layer) side is positive and the B-layer 100B (lower electrode layer) side is negative, the C-layer 100C (piezoelectric layer material) expands in the longitudinal direction (direction orthogonal to the thickness direction). Conversely, when voltage is applied between the upper and lower electrode layers such that the D-layer 140D (upper electrode layer) side is negative and the B-layer 100B (lower electrode layer) side is positive, the C-layer 100C (piezoelectric layer material) contracts in the longitudinal direction. The degree of expansion/contraction corresponds to the value of the voltage that is applied.

Accordingly, as illustrated in FIG. 4B, when voltage of a polarity is applied such that the D-layer 140D (upper electrode layer) is positive and the B-layer 100B (lower electrode layer) is negative, the piezoelectric element including the three layers of the B-layer 100B, the C-layer 100C, and the D-layer 140D expands in the longitudinal direction, and stress in the direction expanding in the surface direction (direction along the Y-axis) is applied to the top surface side of the flexible A-layer 100A. As a result, the arm starting end 141 warps and becomes convex upwards.

In contrast, as illustrated in FIG. 4C, when voltage of a polarity is applied such that the D-layer 140D (upper electrode layer) is negative and the B-layer 100B (lower electrode layer) is positive, the piezoelectric element including the three layers of the B-layer 100B, the C-layer 100C, and the D-layer 140D contracts in the longitudinal direction, and stress in the direction contracting in the surface direction is applied to the top surface side of the flexible A-layer 100A. As a result, the arm starting end 141 warps and becomes convex downwards.

Of course, a configuration is possible in which a C-layer 100C is used whereby the C-layer 100C contracts in the longitudinal direction when voltage is applied between the upper and lower electrode layers such that the D-layer 140D (upper electrode layer) side is positive and the B-layer 100B (lower electrode layer) side is negative, and the C-layer 100C expands in the longitudinal direction when voltage is applied between the upper and lower electrode layers such that the D-layer 140D (upper electrode layer) side is negative and the B-layer 100B (lower electrode layer) side is positive. In such a case, the arm starting end 141 warps and becomes convex downwards when voltage of a positive polarity is applied, and the arm starting end 141 warps and becomes convex upwards when voltage of a negative polarity is applied.

In either case, the deformations illustrated in FIGS. 4B and 4C can be produced by applying voltage of a predetermined polarity between the D-layer 140D (upper electrode layer) and the B-layer 100B (lower electrode layer). Note that the polarization effect differs depending on the material of the piezoelectric element (for example, depending on if bulk or thin film). As such, there are cases in which the relationship between the polarity of the voltage and expansion/contraction is reversed.

The arm extensions 143A operate in the same manner as the arm starting end 141 illustrated in FIGS. 4A to 4C due to the A-layer 100A (base layer), and the piezoelectric elements formed by the B-layer 100B (lower electrode layer), the C-layer 100C (piezoelectric material layer), and the D-layers 141D and 142D (upper electrode layers).

In FIG. 1, the D-layer 100D (not illustrated in the drawing) includes a detection electrode 160D (first detection electrode) that detects displacement of the actuator 140. The detection electrode 160D is formed such that the width of the detection electrode 160D is less than the width of the actuator 140 to allow for wiring.

The detection electrode 160D is provided at the portions where each of the actuators 140 connect to the fixed frame 110. These portions are locations at which the deformation of the actuators 140 is great. Accordingly, providing the detection electrode 160D at these locations makes it possible to stably detect displacement of the actuators 140.

The mirror surface 130 is connected to the fixed frame 110 via the actuators 140 and is supported by the actuators 140 in a state hung above the base. Accordingly, when the actuators 140 warp upward or downward, the mirror surface 130 that is supported in a hung state tilts around the X-axis or, in other words, in the Y-axis direction.

Figure 5A:
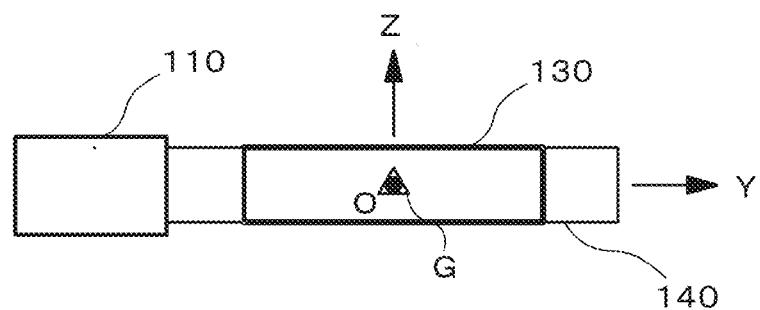
FIG. 5A is a cross-sectional view illustrating (a first) operation of an actuator.

When voltage is not being applied to the various piezoelectric elements of the arm starting end 141 and the arm extension 143A, the mirror surface 130 is supported in a horizontal posture above the base via the actuators 140, as illustrated in FIG. 5A. In FIG. 5A, the white triangle represents the center of gravity G of the mirror surface 130. The center of gravity G coincides with the origin O of the coordinate system.

Figure 5B:
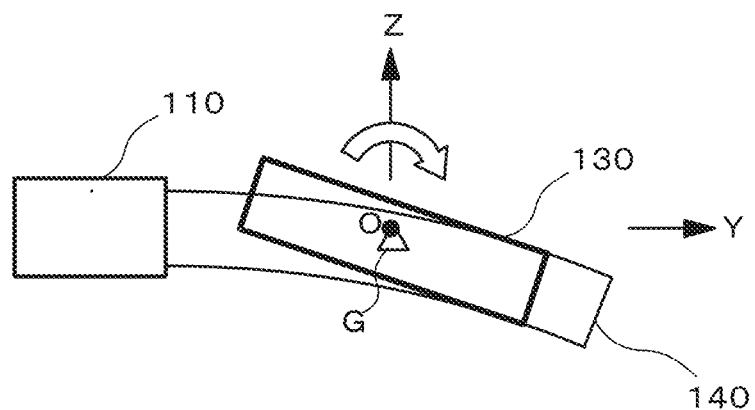
FIG. 5B is a cross-sectional view illustrating (a second) operation of the actuator.

When the arm starting end 141 warps and becomes convex upward, the arm extension 143A adjacent to the arm starting end 141 becomes convex downward, and the arm extension 143A adjacent to the arm extension 143A, which is convex downward, warps and becomes convex upward, the entire actuator 140 tilts such that the +Y end declines. As a result, the mirror surface 130 can be tilted such that the +Y end thereof is declined the most, as illustrated in FIG. 5B.

Figure 5C:
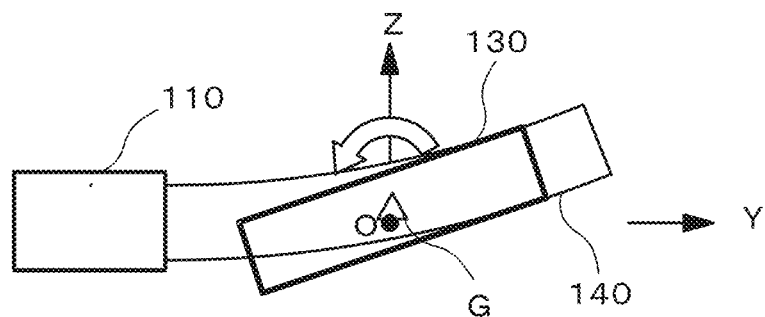
FIG. 5C is a cross-sectional view illustrating (a third) operation of the actuator.

When the arm starting end 141 warps and becomes convex downward, the arm extension 143A adjacent to the arm starting end 141 becomes convex upward, and the arm extension 143A adjacent to the arm extension 143A, which is convex upward, warps and becomes convex downward, the entire actuator 140 tilts such that the −Y end declines. Thus, the mirror surface 130 can be tilted such that the −Y end thereof is declined the most, as illustrated in FIG. 5C.

Voltage of opposite polarity is applied to each of the piezoelectric elements of the actuator 140 on the +X side and the piezoelectric elements of the actuator 140 on the −X side. As such, the actuators 140 can rock the mirror surface 130 around the X-axis with respect to the fixed frame 110.

The degree of tilting corresponds to the value of the voltage that is applied. Accordingly, the tilt angle in the X-axis direction of the mirror surface 130 can be adjusted as desired by adjusting the polarity and the value of the voltage to be applied.

In the movable reflective device 100 according to the present embodiment, the mirror surface 130 that has the reflective surface is connected to the fixed frame 110 via the actuators 140. As such, compared to the supporting means provided by a conventional gimbal structure, a simple design can be obtained and, at the same time, sufficient displacement angles can be ensured. When realizing a gimbal structure by a mechanical pivoting mechanism, the number of components increases, and the structure becomes complex. Alternatively, while the structure can be simplified by realizing a gimbal structure using a torsion bar, the maximum displacement angle is limited to the range of the maximum torsion angle of the torsion bar, and it is difficult to ensure sufficient displacement angles. In the present embodiment, the mirror surface 130 is supported by the actuators 140 and, as such, a simple structure can be obtained and, as the same time, sufficient displacement angles can be ensured.

Thus, the movable reflective device 100 includes the arm starting end 141 and the arm extension 143A that extend along the Y-axis, and piezoelectric elements, which each expand/contract along the longitudinal direction due to the application of voltage of a predetermined polarity, are fixed to the top surface or the bottom surface of the arm starting end 141 and the arm extension 143A. Due to this configuration, the mirror surface 130 can be inclined in the Y-axis direction in a greater manner by causing the piezoelectric elements of the arm starting end 141 and the arm extension 143A to expand/contract by applying voltage to these piezoelectric elements. This configuration makes it possible to ensure sufficient displacement angles around the X-axis.

In the present embodiment, a structure is used in which the actuators 140 and the mirror surface 130 are disposed in the fixed frame 110. However, the fixed frame 110 need not be constituted by a frame body. For example, the fixed frame 110 may be constituted by any desired member, provided that the first ends of the actuators can be fixed thereto. However, since the actuators 140 and the mirror surface 130 are movable constituents in which displacement occurs, it is desirable that contact with external objects be avoided. On this point, in cases in which a frame-like component, such as the fixed frame 110, is provided, the movable constituents can be enclosed therein and, as a result, the movable constituents can be protected from contact with external objects.

The shapes of the fixed frame 110 and the mirror surface 130 are not limited to rectangular and may, for example, be elliptical or polygonal.

As described in detail above, with the movable reflective device 100 according to the present embodiment, the length of the portion of the actuator 140 along the Y-axis direction is longer than the distance along the Y-axis direction from the inner side of the fixed frame 110 to the middle point N of the outer side of the mirror surface 130 and, moreover, this portion is formed in a zigzag shape. Due to this configuration, increases in the disposal area of the actuators 140 can be suppressed and, at the same time, the length of the actuators 140 from the fixed frame 110 to the mirror surface 130 can be increased, thereby making it possible to set the driving frequency of the mirror surface 130 to a desired value. Therefore, with the movable reflective device 100 according to Embodiment 1, it is possible to optimize the driving frequency and reduce the size of the device.

Specifically, since the actuators 140 are connected to the middle points N of the outer sides of the mirror surface 130, hardly any moments in directions other than the XY directions will act on the mirror surface 130, vibrations in the mirror surface 130 will not be biased in any particular direction, and twisting can be prevented. Moreover, in this case, the configuration of actuators 140 can be simplified and the size of the mirror surface 130 can be reduced.

From the perspective of the twist angle of the mirror surface 130, with this movable reflective device 100, the pair of actuators 140 that rock the mirror surface 130 have a zigzag shape obtained by alternately connecting the arm connector 143B and the arm extension 143A. Moreover, the actuators 140 are connected to the middle points N of the outer sides of the mirror surface 130. As a result of this configuration, the twist angle of the mirror surface 130 can be increased while causing the rotational axis of the mirror surface 130 to coincide with the direction connecting the middle points N of the outer sides of the mirror surface 130. Therefore, the mirror surface 130 can be accurately rocked.

Embodiment 2

Next, Embodiment 2 of the present disclosure will be described.

Figure 6:
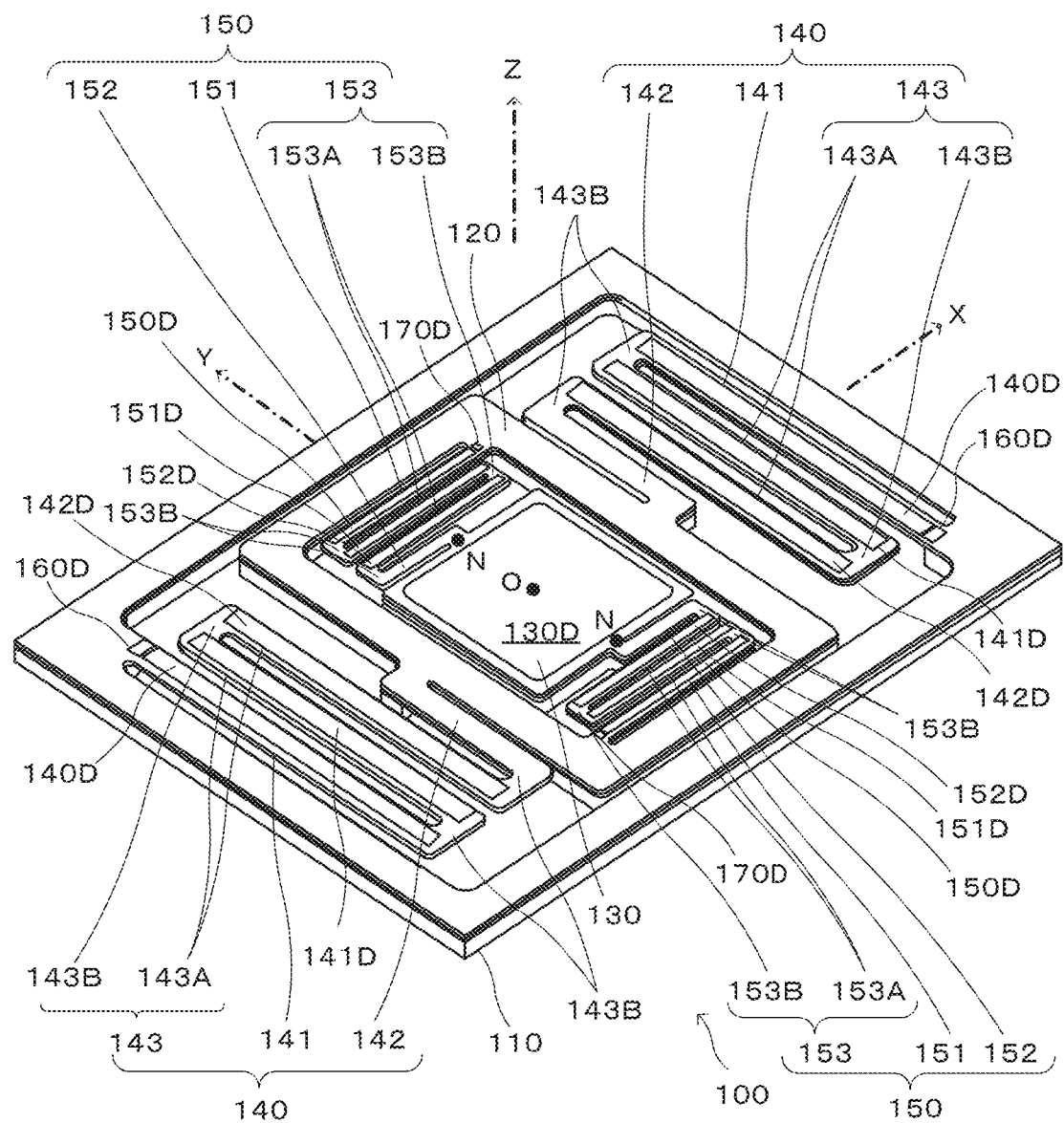
FIG. 6 is a perspective view illustrating the configuration of a movable reflective device according to Embodiment 2 of the present disclosure.
Figure 7:
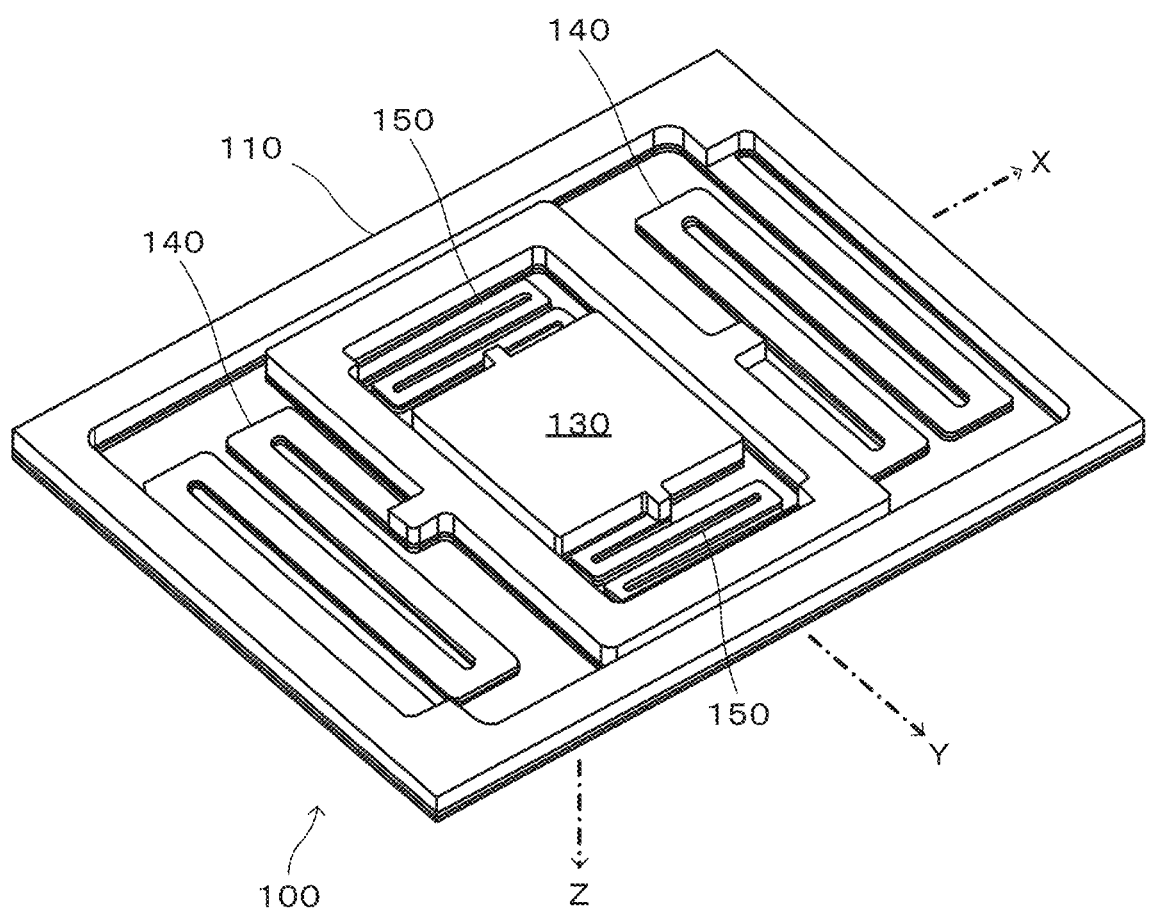
FIG. 7 is a perspective view of the movable reflective device depicted in FIG. 6, viewed from the back side.

As illustrated in FIGS. 6 and 7, the movable reflective device 100 according to Embodiment 2 includes a fixed frame 110 fixed to a base, a movable frame 120 disposed within the fixed frame 110, and a mirror surface 130 disposed within the movable frame 120. Furthermore, the movable reflective device 100 includes a pair of members, namely actuators 140, which connect the fixed frame 110 to the movable frame 120, and a pair of members, namely actuators 150, which connect the movable frame 120 to the mirror surface 130. An A-layer 100A, a B-layer 100B, and a C-layer 100C are laminated in the movable reflective device 100 according to the present embodiment.

The actuators 140 are provided between the fixed frame 110 and the movable frame 120, on both sides in the X-axis direction of the movable frame 120. The actuators 150 are provided between the movable frame 120 and the mirror surface 130, on both sides in the Y-axis direction of the mirror surface 130. The configuration and operations of the actuators 140 are the same as in Embodiment 1. In the present embodiment, the movable frame 120, the actuators 150, and the mirror surface 130 correspond to the rocker.

Figure 8:
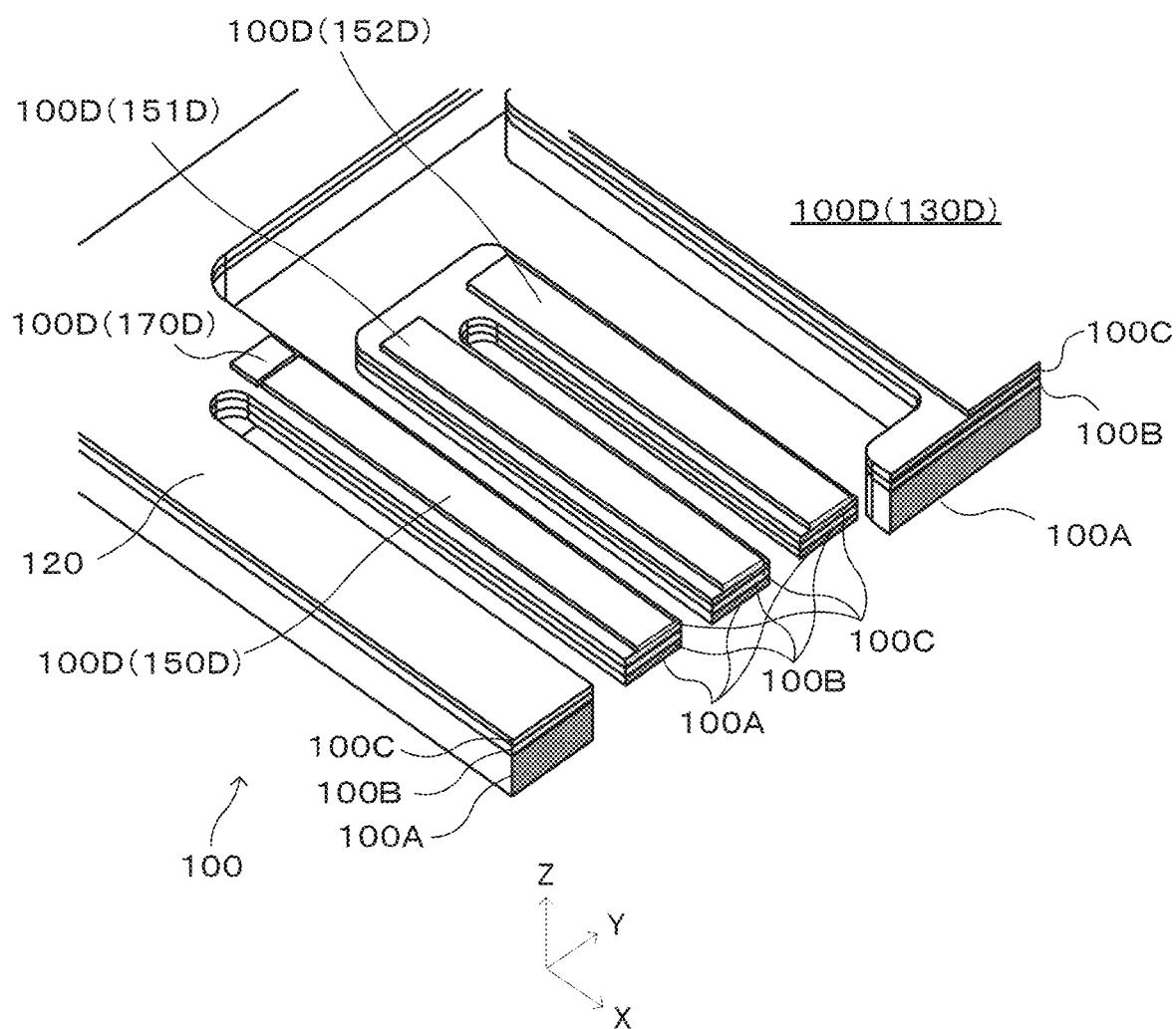
FIG. 8 is a schematic view illustrating the laminated structure of a portion of the movable reflective device depicted in FIG. 6.

As illustrated in FIG. 8, in the movable reflective device 100 according to Embodiment 2 as well, the fixed frame 110, the movable frame 120, the mirror surface 130, and the actuators 140 and 150 each include a three-layer structure including the A-layer 100A, the B-layer 100B, and the C-layer 100C. As illustrated in FIG. 7, the thicknesses of the mirror surface 130 and the actuators 140 and 150 are set so as to be less than the thicknesses of the fixed frame 110 and the movable frame 120. As such, gaps are formed below the mirror surface 130 and the actuators 140 and 150.

The actuators 150 are a pair of flexible members that connect the movable frame 120 to the mirror surface 130. Piezoelectric elements that expand/contract along the X-axis direction are formed on the portions of the actuators 150 that extend along the X-axis direction from the inner side of the movable frame 120. Each of the actuators 150 is disposed on either side in the Y-axis direction of the mirror surface 130, and deforms due to the expansion/contraction of the piezoelectric elements, thereby rocking the mirror surface 130 with respect to the movable frame 120 around a rotational axis extending along the Y-axis direction. Each of the actuators 150 includes an arm starting end 151 as the second arm starting end, an arm terminating end 152 as the second arm terminating end, and an arm relay 153 as the second arm relay.

A first end of the arm starting end 151 is connected to the inner side of the movable frame 120. The arm starting end 151 extends in a straight line along the Y-axis direction between the movable frame 120 and the mirror surface 130, from the first end beyond a middle point N of the outer side of the mirror surface 130.

A first end of the arm terminating end 152 is connected to the middle point N of the outer side of the movable frame 120. The arm terminating end 152 extends parallel to the arm starting end 151.

The arm relay 153 is formed in a zigzag shape by alternately connecting an arm connector 153B, as the second arm connector, that extends along the X-axis direction and an arm extension 153A, as the second arm extension, that extends parallel to the arm starting end 151. A piezoelectric element is formed on each of the arm extensions 153A. Moreover, the arm relay 143 connects a second end of the arm starting end 151 to a second end of the arm terminating end 152.

A piezoelectric element is formed on the arm starting end 151. This piezoelectric element is formed by the B-layer 100B (lower electrode layer), the C-layer 100C (piezoelectric element material layer), and a D-layer 150D (upper electrode layer).

Piezoelectric elements are formed on the arm extensions 153A. These piezoelectric elements are formed by the B-layer 100B (lower electrode layer), the C-layer 100C (piezoelectric element material layer), and the D-layers 151D and 152D (upper electrode layers).

Figure 9A:
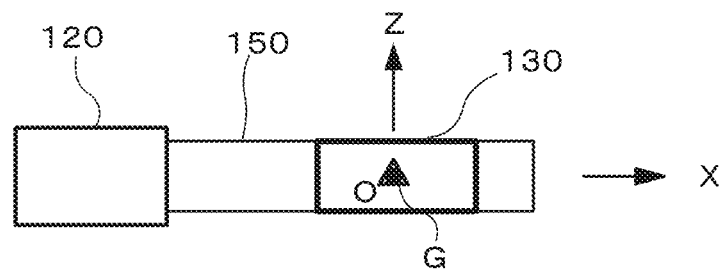
FIG. 9A is a cross-sectional view illustrating (a first) operation of an actuator.

When voltage is not being applied to the various piezoelectric elements of the actuators 150, the mirror surface 130 is supported in a horizontal posture by the movable frame 120, as illustrated in FIG. 9A. In FIG. 9A, the white triangle represents the center of gravity G of the mirror surface 130. The center of gravity G coincides with the origin O of the coordinate system.

Figure 9B:
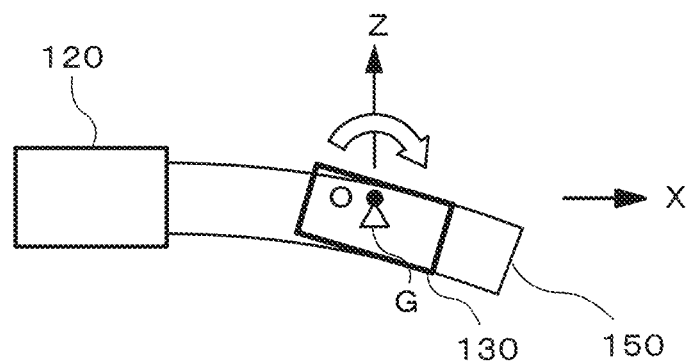
FIG. 9B is a cross-sectional view illustrating (a second) operation of the actuator.

When the arm starting end 151 warps and becomes convex upward, the arm extension 153A adjacent to the arm starting end 151 becomes convex downward, and the arm extension 153A adjacent to the arm extension 153A, which is convex downward, warps and becomes convex upward, the entire actuator 150 tilts such that the +X end declines. Thus, the mirror surface 130 can be tilted with respect to the movable frame 120 such that the +X end thereof is declined the most, as illustrated in FIG. 9B.

Figure 9C:
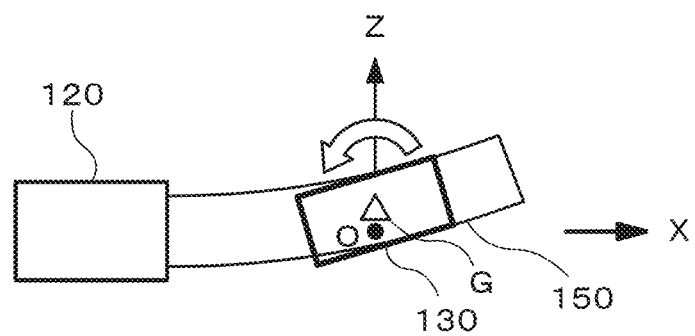
FIG. 9C is a cross-sectional view illustrating (a third) operation of the actuator.

When the arm starting end 151 warps and becomes convex downward, the arm extension 153A adjacent to the arm starting end 151 becomes convex upward, and the arm extension 153A adjacent to the arm extension 153A, which is convex upward, warps and becomes convex downward, the entire actuator 150 tilts such that the −X end declines. Thus, the mirror surface 130 can be tilted with respect to the movable frame 120 such that the −X end thereof is declined the most, as illustrated in FIG. 9C.

Voltage of opposite polarity is applied to each of the piezoelectric elements on the +Y side and the piezoelectric elements on the −Y side of the pair of actuators 150. As such, the actuators 150 can rock the mirror surface 130 around the Y-axis with respect to the movable frame 120.

The degree of tilt corresponds to the value of the voltage that is applied. Accordingly, the tilt angle in the X-axis direction of the mirror surface 130 can be adjusted as desired by adjusting the polarity and the value of the voltage to be applied.

The movable reflective device 100 includes the arm starting end 151 and the arm extension 153A that extends along the X-axis, and piezoelectric elements, which each expand/contract along the longitudinal direction due to the application of voltage of a predetermined polarity, are fixed to the top surface or the bottom surface of the arm starting end 151 and the arm extension 153A. Due to this configuration, the mirror surface 130 can be tilted in the X-axis direction (rotated around the Y-axis) in a greater manner by applying voltage to the piezoelectric elements of the arm starting end 151 and the arm extension 153A, thereby causing these piezoelectric elements to expand/contract. This configuration makes it possible to ensure sufficient displacement angles around the Y-axis.

A detection electrode 170D as the second detection electrode is provided at the portions where the actuators 150 connect to the movable frame 120. These portions are locations at which the deformation of the actuators 150 is great. Accordingly, providing the detection electrode 170D at these locations makes it possible to stably detect displacement of the actuators 150.

As described above, with the movable reflective device 100 according to the present embodiment, the length of the portion of the actuator 150 along the X-axis direction is longer than the distance along the X-axis direction from the inner side of the movable frame 120 to the middle point N of the outer side of the mirror surface 130. Due to this configuration, the setting range of the driving frequency of the mirror surface 130 can be broadened and, as such, the ratio of the driving frequency of the movable frame 120 to the driving frequency of the mirror surface 130 can be set to the desired value. Therefore, with the movable reflective device 100 according to Embodiment 2, it is possible to optimize the driving frequencies and reduce the size of the device.

In Embodiment 2, the actuators 140 are disposed with two-fold rotational symmetry about the mirror surface 130. The actuators 150 are also disposed with two-fold rotational symmetry about the mirror surface 130. Moreover, the direction from the first end of the arm starting end 141 that connects to the fixed frame 110 toward the second end, and the direction from the first end of the arm starting end 151 that connects to the movable frame 120 toward the second end are the same with respect to the rotational direction around the center of gravity G of the mirror surface 130.

The actuators 140 and the actuators 150 are formed into zigzag shapes about the middle points N of the outer sides of the rocking subject. Due to this configuration, the ratio between the driving frequencies can be optimized and the size of the movable frame 120 can be reduced. Additionally, the mirror surface 130 can be held and rocked in a well-balanced manner without becoming biased.

Note that the directions of the actuators 150 may differ. Specifically, the direction from the first end of the arm starting end 141 connected to the fixed frame 110 toward the second end, and the direction from the first end of the arm starting end 151 connected to the movable frame 120 toward the second end may be opposite directions with respect to the rotational direction around the mirror surface 130.

For example, in a case in which a beam is two-dimensionally scanned by the movable reflective device 100 according to Embodiment 2, when distortion occurs in the projected image, there are cases in which the distortion of the image is corrected by using a movable reflective device 100 in which the directions of the actuators 150 differ. In such cases, using a movable reflective device 100 in which the actuators 150 are disposed in opposite directions can be a solution.

There are other various methods for correcting distortions in images caused by two-dimensional scanning. For example, it may be possible to correct the distortion of the projected image by applying a weight to the movable frame 120 to correct axial deviation of the rocked state of the movable frame 120 and the mirror surface 130.

Note that a weight may be attached to components other than the movable frame 120. For example, a weight may be attached to the mirror surface 130. In another example, a weight may be attached to one or both of the actuators 140 and the actuators 150.

The movable reflective device 100 according to the embodiment described above can tilt the reflective surface formed on the surface of the mirror surface 130 with degrees of freedom on two axes. As such, the movable reflective device 100 can be incorporated into a two-dimensional scanning apparatus that two-dimensionally scans light beams or directional radio waves, and this apparatus can be used to perform two-dimensional scanning. In cases in which light beams are scanned using this two-dimensional scanning apparatus, a projector that projects images on a screen can be realized. In cases in which directional radio waves are scanned using this two-dimensional scanning apparatus, a vehicle-mounted radar or the like can be realized.

In particular, the movable reflective device 100 according to the embodiment described above is suitable as a small, low current consumption MEMS device. As such, the movable reflective device 100 is ideal for incorporation and use in small devices such as mobile phones, smartphones, and tablet-type electronic terminals, and is suitable for applications that add projector functions to such small devices. In recent years, radars have become an essential technology for automobiles, and there is a need to irradiate directional radio waves over a wide range. Using the movable reflective device 100 according to the embodiment described above makes it possible to realize a small automotive device capable of wide-range radar irradiation.

As described in detail above, according to the present embodiment, the pairs of actuators 140 and 150 that rock the mirror surface 130 (and the movable frame 120) have a zigzag shape and are connected to the middle points N of the outer sides of the mirror surface 130 (and the movable frame 120). As a result of this configuration, the twist angle of the mirror surface 130 (and the movable frame 120) can be increased while accurately rocking the mirror surface 130 (and the movable frame 120) in the direction in which the rotational axis of the mirror surface 130 (and the movable frame 120) passes through the middle points N of the outer sides of the mirror surface 130 (and the movable frame 120). That is, the mirror surface 130 (and the movable frame 120) can be rocked in an optimal state.

In the embodiment described above, the number of zigzags (number of bends) of the actuators 140 and 150 is set to three. However, the number of bends may be set to four or more.

In the embodiment described above, a configuration is described in which the piezoelectric elements formed on the arm starting ends 141 and 151 and the arm extensions 143A and 153A expand/contract. However, the present disclosure is not limited thereto. A configuration is possible in which, in addition to the expanding/contracting of the piezoelectric elements formed on the arm starting ends 141 and 151 and the arm extensions 143A and 153A, piezoelectric elements formed on the arm terminating ends 142 and 152 and the arm connectors 143B and 153B also expand/contract. With such a configuration, the arm terminating ends 142 and 152 and the arm connectors 143B and 153B are formed by the B-layer 100B (lower electrode layer), the C-layer 100C (piezoelectric material layer), and the D-layer 100D (upper electrode layer).

In addition, a configuration is possible in which the piezoelectric elements formed on the arm starting ends 141 and 151 and on the arm extensions 143A and 153A do not expand/contract, and the piezoelectric elements formed on the arm terminating ends 142 and 152 and the arm connectors 143B and 153B expand/contract. With such a configuration, the arm starting ends 141 and 151 and the arm extensions 143A and 153A are formed by the B-layer 100B (lower electrode layer) and the C-layer 100C (piezoelectric material layer), for example. Additionally, the arm terminating ends 142 and 152 and the arm connectors 143B and 153B are formed by the B-layer 100B (lower electrode layer), the C-layer 100C (piezoelectric material layer), and the D-layer 100D (upper electrode layer).

Thus, in the actuators 140 and 150, it is possible to appropriately design, on the basis of the rocking state required for the movable frame 120 and the mirror surface 130, which portions to cause to expand/contract using piezoelectric elements.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2016-218812, filed on Nov. 9, 2016, the entire disclosure of which is incorporated by reference herein.

INDUSTRIAL APPLICABILITY

The present disclosure can be used as a driving element of a reflective mirror.

REFERENCE SIGNS LIST

100 Movable reflective device
100A A-layer (actuator main body)
100B B-layer
100C C-layer
100D D-layer
110 Fixed frame
120 Movable frame
130 Mirror surface
130D D-layer (reflective layer)
140 Actuator (first actuator)
140D, 141D, 142D D-layer (upper electrode layer)
141 Arm starting end
142 Arm terminating end
143 Arm relay
143A Arm extension
143B Arm connector
150 Actuator (second actuator)
150D, 151D, 152D D-layer (upper electrode layer)
151 Arm starting end
152 Arm terminating end
153 Arm relay
153A Arm extension
153B Arm connector
160D, 170D D-layer (detection electrode)

What is claimed is:
1. A movable reflective device comprising:
a fixed frame, the fixed frame having a flat plate-like shape;
a rocker that includes a reflective surface, the rocker being disposed within the fixed frame such that a gap exists between the rocker and the fixed frame, a mirror surface being formed on a first side of the rocker; and
a first actuator that connects the fixed frame to the rocker, the first actuator being a pair of flexible members on which a first piezoelectric element, configured to be capable of expansion and contraction, is formed at a portion extending along a first direction or a portion extending along a second direction that intersects the first direction, each of the pair of members being disposed on each side in the second direction of the rocker, the first actuator being deformed by the expansion and contraction of the first piezoelectric element, thereby causing the rocker to rock with respect to the fixed frame around a first rotational axis, wherein
the first actuator includes:
a first arm starting end on which the first piezoelectric element is formed, a first end of the first arm starting end being connected to an inner side of the fixed frame, the first arm starting end extending in a straight line, along the first direction through the gap between the fixed frame and the rocker, from the first end to beyond a middle point of an outer side of the rocker,
a first arm terminating end including a first end connected to the middle point of the outer side of the rocker, the first arm terminating end extending parallel to the first arm starting end, and
a first arm relay that connects a second end of the first arm starting end to a second end of the first arm terminating end, the first arm relay being formed in a zigzag by alternately connecting a first arm connector extending along the second direction and a first arm extension extending parallel to the first arm starting end and on which the first piezoelectric element is formed, and
the first arm terminating end includes:
a first portion on which the first piezoelectric element is formed, the first portion having a thickness that is less than a thickness of the rocker such that the first portion deflects by the expansion and contraction of the first piezoelectric element to cause the rocker to rock, and
a second portion that has a thickness greater than the thickness of the first portion and connects the first portion to the rocker, wherein the rocker includes:
a movable frame comprising a flat plate-like shape, the movable frame being connected to the first actuator and disposed within the fixed frame such that a gap exists between the movable frame and the fixed frame,
a mirror surface having a flat plate-like shape, the mirror surface including a reflective surface and being disposed within the movable frame such that a gap exists between the mirror surface and the movable frame, and
a second actuator that connects the movable frame to the mirror surface, the second actuator being a pair of flexible members on which a second piezoelectric element, configured to be capable of expansion and contraction, is formed at a portion extending along the first direction or a portion extending along the second direction, each of the pair of members being disposed on each side in the first direction of the mirror surface, the second actuator being deformed by the expansion and contraction of the second piezoelectric element, thereby causing the mirror surface to rock with respect to the movable frame around a second rotational axis that intersects the first rotational axis, wherein the second arm terminating end includes:
a third portion on which the second piezoelectric element is formed, the third portion having a thickness that is less than a thickness of the mirror surface such that the third portion deflects by the expansion and contraction of the second piezoelectric element to cause the mirror surface to rock, and
a fourth portion that has a thickness greater than the thickness of the third portion and connects the third portion to the mirror surface.

2. The movable reflective device according to claim 1, wherein a weight is attached to the rocker.

3. The movable reflective device according to claim 1, wherein a boundary between the first portion and the second portion is provided along a direction of the first rotational axis.

4. The movable reflective device according to claim 1, wherein the thickness of the second portion is the same as the thickness of the rocker.

5. The movable reflective device according to claim 1, wherein the second actuator includes:
a second arm starting end on which the second piezoelectric element is formed, a first end of the second arm starting end being connected to an inner side of the movable frame, the second arm starting end extending in a straight line, along the second direction through the gap between the movable frame and the mirror surface, from the first end to beyond a middle point of an outer side of the mirror surface,
a second arm terminating end including a first end connected to the middle point of the outer side of the mirror surface, the second arm terminating end extending parallel to the second arm starting end, and
a second arm relay that connects a second end of the second arm starting end to a second end of the second arm terminating end, the second arm relay being formed in a zigzag by alternately connecting a second arm connector extending along the first direction and a second arm extension extending parallel to the second arm starting end and on which the second piezoelectric element is formed.

6. The movable reflective device according to claim 5, wherein
each of the first actuators is disposed with two-fold rotational symmetry about the mirror surface,
each of the second actuators is disposed with two-fold rotational symmetry about the mirror surface, and
a direction from the first end toward the second end of the first arm starting end, and a direction from the first end toward the second end of the second arm starting end are the same or opposite direction with respect to a rotational direction around the mirror surface.

7. The movable reflective device according to claim 1, wherein a boundary between the third portion and the fourth portion is provided along a direction of the second rotational axis.

8. The movable reflective device according to claim 1, wherein the thickness of the fourth portion is the same as the thickness of the mirror surface.

9. A movable reflective device, comprising:
a fixed frame, the fixed frame having a flat plate-like shape;
a rocker that includes a reflective surface, the rocker being disposed within the fixed frame such that a gap exists between the rocker and the fixed frame, a mirror surface being formed on a first side of the rocker; and
a first actuator that connects the fixed frame to the rocker, the first actuator being a pair of flexible members on which a first piezoelectric element, configured to be capable of expansion and contraction, is formed at a portion extending along a first direction or a portion extending along a second direction that intersects the first direction, each of the pair of members being disposed on each side in the second direction of the rocker, the first actuator being deformed by the expansion and contraction of the first piezoelectric element, thereby causing the rocker to rock with respect to the fixed frame around a first rotational axis, wherein the first actuator includes:

a first arm starting end on which the first piezoelectric element is formed, a first end of the first arm starting end being connected to an inner side of the fixed frame, the first arm starting end extending in a straight line, along the first direction through the gap between the fixed frame and the rocker, from the first end to beyond a middle point of an outer side of the rocker, a first arm terminating end including a first end connected to the middle point of the outer side of the rocker, the first arm terminating end extending parallel to the first arm starting end, and a first arm relay that connects a second end of the first arm starting end to a second end of the first arm terminating end, the first arm relay being formed in a zigzag by alternately connecting a first arm connector extending along the second direction and a first arm extension extending parallel to the first arm starting end and on which the first piezoelectric element is formed, the rocker includes:

a movable frame comprising a flat plate-like shape, the movable frame being connected to the first actuator and disposed within the fixed frame such that a gap exists between the movable frame and the fixed frame, a mirror surface having a flat plate-like shape, the mirror surface including a reflective surface and being disposed within the movable frame such that a gap exists between the mirror surface and the movable frame, and a second actuator that connects the movable frame to the mirror surface, the second actuator being a pair of flexible members on which a second piezoelectric element, configured to be capable of expansion and contraction, is formed at a portion extending along the first direction or a portion extending along the second direction, each of the pair of members being disposed on each side in the first direction of the rocker, the second actuator being deformed by the expansion and contraction of the second piezoelectric element, thereby causing the mirror surface to rock with respect to the movable frame around a second rotational axis that intersects the first rotational axis, and the movable reflective device further includes:

a first detection electrode, provided at a first boundary portion where the first actuator connects to the fixed frame, and provided between the first actuator and the fixed frame along a line in the first direction, that detects displacement of the first actuator, and a second detection electrode, provided at a second boundary portion where the second actuator connects to the movable frame, and provided between the second actuator and the movable frame along the line in the second direction, that detects displacement of the second actuator.

10. A movable reflective device comprising:

a fixed frame, the fixed frame having a flat plate-like shape;

a rocker that includes a reflective surface, the rocker being disposed within the fixed frame such that a gap exists between the rocker and the fixed frame, a mirror surface being formed on a first side of the rocker; and a first actuator that connects the fixed frame to the rocker, the first actuator being a pair of flexible members on which a first piezoelectric element, configured to be capable of expansion and contraction, is formed at a portion extending along a first direction or a portion extending along a second direction that intersects the first direction, each of the pair of members being disposed on each side in the second direction of the rocker, the first actuator being deformed by the expansion and contraction of the first piezoelectric element, thereby causing the rocker to rock with respect to the fixed frame around a first rotational axis, wherein the first actuator includes:

a first arm starting end on which the first piezoelectric element is formed, a first end of the first arm starting end being connected to an inner side of the fixed frame, the first arm starting end extending in a straight line, along the first direction through the gap between the fixed frame and the rocker, from the first end to beyond a middle point of an outer side of the rocker, a first arm terminating end including a first end connected to the middle point of the outer side of the rocker, the first arm terminating end extending parallel to the first arm starting end, a first arm relay that connects a second end of the first arm starting end to a second end of the first arm terminating end, the first arm relay being formed in a zigzag by alternately connecting a first arm connector extending along the second direction and a first arm extension extending parallel to the first arm starting end and on which the first piezoelectric element is formed, and a first detection electrode, provided at a first boundary portion where the first actuator connects to the fixed frame, and provided between the first actuator and the fixed frame along a line in the first direction, that detects displacement of the first actuator.

* * * * *